(12) United States Patent
Tsutsue

(10) Patent No.: US 8,564,136 B2
(45) Date of Patent: Oct. 22, 2013

(54) SEMICONDUCTOR DEVICE AND METHOD FOR FABRICATING THE SAME

(75) Inventor: Makoto Tsutsue, Toyama (JP)

(73) Assignee: Panasonic Corporation, Osaka (JP)

( * ) Notice: Subject to any disclaimer, the term of this patent is extended or adjusted under 35 U.S.C. 154(b) by 250 days.

(21) Appl. No.: 13/038,974

(22) Filed: Mar. 2, 2011

(65) Prior Publication Data

US 2011/0147882 A1 Jun. 23, 2011

Related U.S. Application Data

(63) Continuation of application No. PCT/JP2009/005151, filed on Oct. 5, 2009.

(30) Foreign Application Priority Data

Jan. 20, 2009 (JP) .................. 2009-010156

(51) Int. Cl.
*H01L 23/48* (2006.01)
*H01L 21/4763* (2006.01)

(52) U.S. Cl.
USPC ...... 257/773; 257/734; 257/774; 257/E23.01; 257/E29.111; 438/663; 438/687

(58) Field of Classification Search
USPC .................. 257/751, 750, 758, 774, E21.579, 257/E23.145, 773, 734, E23.01, E29.111; 438/627, 653, 687
See application file for complete search history.

(56) References Cited

U.S. PATENT DOCUMENTS

| | | | |
|---|---|---|---|
| 6,686,662 B2* | 2/2004 | Merchant et al. | 257/751 |
| 6,893,985 B2* | 5/2005 | Goodner | 438/795 |
| 7,052,990 B2* | 5/2006 | Kim | 438/637 |
| 7,135,402 B2* | 11/2006 | Lin et al. | 438/639 |
| 7,176,120 B2* | 2/2007 | Kanamura | 438/622 |
| 7,186,640 B2* | 3/2007 | Huang et al. | 438/622 |
| 7,301,107 B2* | 11/2007 | Karthikeyan et al. | 174/262 |
| 7,329,956 B1* | 2/2008 | Yu et al. | 257/758 |
| 7,338,893 B2* | 3/2008 | Engbrecht et al. | 438/627 |
| 7,564,136 B2* | 7/2009 | Yeh et al. | 257/773 |
| 8,138,082 B2* | 3/2012 | Torres et al. | 438/618 |
| 8,343,868 B2* | 1/2013 | Edelstein et al. | 438/643 |
| 2002/0155700 A1* | 10/2002 | Chen et al. | 438/639 |
| 2002/0187625 A1 | 12/2002 | Shimooka et al. | |
| 2006/0116000 A1 | 6/2006 | Yamamoto | |
| 2007/0117371 A1* | 5/2007 | Engbrecht et al. | 438/622 |
| 2008/0188088 A1 | 8/2008 | Chen et al. | |
| 2008/0254631 A1 | 10/2008 | Shimayama et al. | |
| 2008/0290518 A1* | 11/2008 | Yang et al. | 257/751 |

FOREIGN PATENT DOCUMENTS

JP 2005-223195 8/2005

* cited by examiner

*Primary Examiner* — Zandra Smith
*Assistant Examiner* — Tsz Chiu
(74) *Attorney, Agent, or Firm* — McDermott Will & Emery LLP

(57) ABSTRACT

A semiconductor device includes an interlayer dielectric with a single-layer structure having a plurality of pores. The porosity of the interlayer dielectric per unit volume varies in a thickness direction.

7 Claims, 4 Drawing Sheets

SEMICONDUCTOR DEVICE AND METHOD FOR FABRICATING THE SAME

CROSS-REFERENCE TO RELATED APPLICATIONS

This is a continuation of PCT International Application PCT/JP2009/005151 filed on Oct. 5, 2009, which claims priority to Japanese Patent Application No. 2009-010156 filed on Jan. 20, 2009. The disclosures of these applications including the specifications, the drawings, and the claims are hereby incorporated by reference in their entirety.

BACKGROUND

The present disclosure relates to semiconductor devices each including an interlayer dielectric having pores, and methods for fabricating the same.

With miniaturization of semiconductor devices and an increase in the integration density thereof, a decrease in the propagation speed of an electrical signal due to an increase in interconnect resistance and an increase in interconnect capacitance have become a more serious problem.

In particular, in a highly integrated semiconductor device, an increase in interconnect capacitance leads to a decrease in the operation speed of the semiconductor device, thereby suppressing the increase in interconnect capacitance by using a material having a low dielectric constant for an interlayer dielectric, i.e., by using a low-dielectric-constant interlayer dielectric. Moreover, in recent years, development and practical use of a material of which the dielectric constant is reduced by making SiOC, etc., porous have been also studied.

A conventional semiconductor device using a low-dielectric-constant interlayer dielectric (see Japanese Patent Publication No. 2007-250706) will be described below with reference to FIG. 6. In the conventional semiconductor device, films having different properties are used, e.g., as an insulating film (interconnect layer insulating film) in which an interconnect is formed, and an insulating film (via layer insulating film) in which a via is formed.

Specifically, as illustrated in FIG. 6, a first insulating film 12 having pores is formed on a substrate 11, and then a second insulating film 13 having pores is formed on the first insulating film 12. Here, the material and deposition conditions of the second insulating film 13 are selected so that the carbon content of the second insulating film 13 is greater than that of the first insulating film 12. Next, an interlayer dielectric obtained by stacking the first and second insulating films 12 and 13 having different carbon contents is subjected to fabrication processes, such as lithography, dry etching, ashing, and cleaning, thereby forming a via hole 14 and an interconnect trench 15 in the first insulating film 12 and the second insulating film 13, respectively, as illustrated in FIG. 6. Next, although not shown, an interconnect structure including an interconnect and a via is formed by embedding a metal, such as Cu, in the interconnect trench 15 and the via hole 14.

The above-described conventional interlayer dielectric configuration described in Japanese Patent Publication No. 2007-250706 has a hybrid structure obtained by stacking two insulating films having different carbon contents, and one of the features of the conventional interlayer dielectric configuration is that the carbon content of the interconnect layer insulating film (the second insulating film 13) is greater than that of the via layer insulating film (the first insulating film 12). Typically, with an increase in the carbon content of an insulating film, the etch rate thereof tends to be higher. Therefore, when the interconnect layer insulating film is etched, i.e., when the interconnect trench is formed by etching, the method described in Japanese Patent Publication No. 2007-250706 can increase the etch selectivity to the via layer insulating film. This allows the depth of the interconnect trench to be uniform, and enables the fabrication of a semiconductor device having an interconnect structure with a small variation in interconnect resistance.

SUMMARY

However, in the conventional semiconductor device described in Japanese Patent Publication No. 2007-250706, the interlayer dielectric in which a single interconnect structure is formed includes a plurality of films, and thus, the interface between different types of films perpendicularly crosses the interconnect or the via. Therefore, such different types of films tend to be separated from each other at the interface between the different types of films, and the interface tends to form a leakage path between an adjacent pair of interconnects or between an adjacent pair of vias, thereby degrading the reliability of the semiconductor device. The leakage path between the adjacent pair of interconnects or between the adjacent pair of vias herein includes a leakage path between an interconnect and an adjacent via. This applies to the following description.

In view of the above, it is an object of the present disclosure to provide a semiconductor device which has an interconnect structure formed in an interlayer dielectric having regions with different film qualities and reduces separation of films at the interface therebetween and leakage between an adjacent pair of interconnects or between an adjacent pair of vias, thereby preventing or reducing the degradation of the reliability of the semiconductor device.

In order to achieve the above object, a semiconductor device according to the present disclosure is directed to a semiconductor device including an interlayer dielectric with a single-layer structure having a plurality of pores, wherein a porosity of the interlayer dielectric per unit volume varies in a thickness direction.

According to the semiconductor device of the present disclosure, the porosity of the interlayer dielectric with a single-layer structure per unit volume varies in the thickness direction. This enables the formation of an interconnect structure in an interlayer dielectric which has regions with different film qualities and in which no interface exists. Therefore, since no interface between films exists in the interlayer dielectric, films are not separated from each other in the interlayer dielectric. Furthermore, since there does not exist any interface located in the interlayer dielectric and forming a leakage path between an adjacent pair of interconnects with different potentials or between an adjacent pair of vias with different potentials, this can increase the reliability of the semiconductor device. Furthermore, the porosity profile of the interlayer dielectric in the thickness direction is set so that the porosity of an interconnect formation region of the interlayer dielectric (an upper portion of the interlayer dielectric) is higher than that of a via formation region of the interlayer dielectric (a lower portion of the interlayer dielectric), thereby increasing the etch selectivity when an interconnect trench is formed by etching. Specifically, the via formation region of the interlayer dielectric acts as an etching stopper, thereby providing greater control over fabrication and reducing variations in interconnect resistance.

Such an interlayer dielectric of which the porosity varies in the thickness direction can be formed by using a precursor which is a material for forming at least a skeleton and porogens which are a pore-forming material.

In the semiconductor device of the present disclosure, the interlayer dielectric may have a first region of which a porosity is relatively high, a second region of which a porosity is relatively low, and a third region which is interposed between the first region and the second region and of which a porosity continuously varies.

The semiconductor device of the present disclosure may further include: an interconnect formed in at least an upper portion of the interlayer dielectric; and a via formed in at least a lower portion of the interlayer dielectric and connected to the interconnect as described above. A porosity of a region of the interlayer dielectric located in a range between a height of an upper surface of the interconnect and a height of a lower surface of the interconnect is preferably higher than that of a region of the interlayer dielectric located in a range between a height of a surface of the via connected to the interconnect and a height of a lower surface of the via.

A method for fabricating a semiconductor device according to the present disclosure is directed to a method for fabricating a semiconductor device including an interlayer dielectric with a single-layer structure having a plurality of pores. The method includes: forming the interlayer dielectric such that a porosity of the interlayer dielectric per unit volume varies in a thickness direction.

According to the method of the present disclosure, the above-described semiconductor device according to the present disclosure can be obtained.

In the method of the present disclosure, in the forming the interlayer dielectric, the interlayer dielectric may be formed to have a first region of which a porosity is relatively high, a second region of which a porosity is relatively low, and a third region which is interposed between the first region and the second region and of which a porosity continuously varies.

In the method of the present disclosure, in the forming the interlayer dielectric, the interlayer dielectric is preferably formed by chemical vapor deposition. This enables the formation of an interlayer dielectric of which the porosity varies in the thickness direction.

In the method of the present disclosure, the forming the interlayer dielectric preferably includes: forming a film containing a pore-forming material by using a precursor which forms at least a skeleton of the interlayer dielectric and the pore-forming material while changing a flow rate of at least one of the precursor and the pore-forming material over time; and removing the pore-forming material from the film by subjecting the film to heat treatment or irradiating the film with electron beams or ultraviolet light, thereby forming the interlayer dielectric. This can ensure the formation of the interlayer dielectric of which the porosity varies in the thickness direction.

According to the present disclosure, in a semiconductor device having an interconnect structure formed in an interlayer dielectric having regions with different film qualities, no interface exists in the interlayer dielectric. This can reduce separation of films at the interface therebetween and leakage between an adjacent pair of interconnects or between an adjacent pair of vias, thereby preventing or reducing the degradation of the reliability of the semiconductor device.

Specifically, the present disclosure relates to semiconductor devices each including an interlayer dielectric having pores, and methods for fabricating the same, and an interconnect structure can be formed in an interlayer dielectric which has regions with different film qualities, in particular, regions with different porosities, and in which no interface exists. This can reduce separation of films at the interface therebetween and leakage between an adjacent pair of interconnects or between an adjacent pair of vias, thereby preventing or reducing the degradation of the reliability of the semiconductor device. Thus, the present disclosure is very useful.

DETAILED DESCRIPTION

Embodiment

A semiconductor device according to an embodiment of the present disclosure and a method for fabricating the same will be described below with reference to the drawings.

Figure 1:
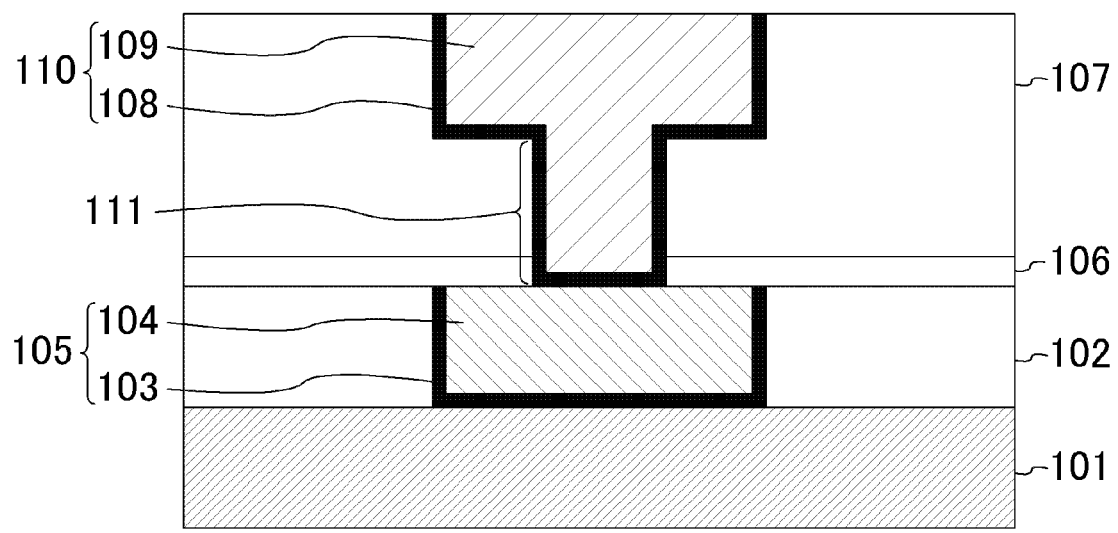
FIG. 1 is a diagram illustrating a cross-sectional structure of a semiconductor device according to an embodiment of the present disclosure.

FIG. 1 illustrates a cross-sectional structure of the semiconductor device according to this embodiment. As illustrated in FIG. 1, a first interconnect 105 is formed in a first insulating film 102 made of, e.g., silicon dioxide ($SiO_2$) and formed on a substrate 101 made of, e.g., Si. Specifically, a conductive film 104 (hereinafter referred to as the "interconnect conductive film 104") which is used as an interconnect and made of, e.g., copper (Cu) is embedded in an interconnect trench formed in the first insulating film 102 with a barrier metal film 103 of, e.g., tantalum nitride (TaN) interposed therebetween. A second insulating film 106 made of, e.g., silicon carbide (SiC) is formed, as a film for preventing or reducing diffusion of metals, on the first insulating film 102 to cover the first interconnect 105.

A third insulating film 107 made of a carbon-containing silicon oxide film (SiOC film) having, e.g., a dielectric constant less than or equal to about 3.0 is formed on the second insulating film 106. An interconnect trench is formed in at least an upper portion of the third insulating film 107, and an interconnect conductive film 109 made of, e.g., Cu is embedded in the interconnect trench with a barrier metal film 108 of, e.g., TaN interposed therebetween, thereby forming a second interconnect 110. In order to provide electrical connection between the first interconnect 105 and the second interconnect 110, a via 111 is formed to pass through at least a lower portion of the third insulating film 107 and the second insulating film 106.

Figure 2:
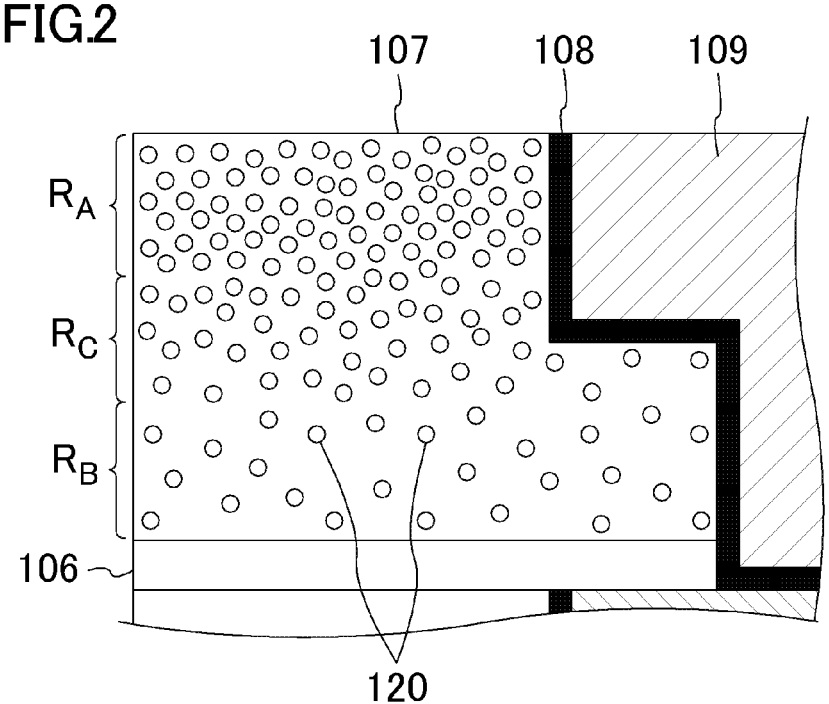
FIG. 2 is a diagram illustrating a cross-sectional structure of an interlayer dielectric and its vicinity of the semiconductor device according to the embodiment of the present disclosure.

FIG. 2 illustrates a cross-sectional structure of the third insulating film 107 which is a distinctive component of the semiconductor device according to this embodiment and the vicinity of the third insulating film 107.

As illustrated in FIG. 2, the third insulating film 107 is an interlayer dielectric having a single-layer structure. Specifically, no interface exists in the third insulating film 107. The third insulating film 107 has a plurality of pores 120, and the porosity of the third insulating film 107 per unit volume (the ratio of the total volume of pores existing in an object to the volume of the object) varies in a thickness direction (in a direction perpendicular to the principal surface of the substrate 101).

Specifically, as illustrated in FIG. 2, the porosity of a region (first region $R_A$) of the third insulating film 107 located in the range between the height of the upper surface of the second interconnect 110 and the height of the lower surface thereof is higher than that of a region (second region $R_B$) of the third insulating film 107 located in the range between the height of the surface of the via 111 connected to the second interconnect 110 and the height of the lower surface of the via 111. That is, the third insulating film 107 has regions with different film qualities.

In this embodiment, as illustrated in FIG. 2, the third insulating film 107 has a third region $R_C$ which is interposed between the first region $R_A$ and the second region $R_B$ and of which the porosity continuously varies. The porosity of the third region $R_C$ decreases continuously from the edge of the third region $R_C$ located near the first region $R_A$ to the edge thereof located near the second region $R_B$.

According to this embodiment described above, the porosity of the third insulating film 107 formed as an interlayer dielectric with a single-layer structure (i.e., as a single continuous film) per unit volume varies in the thickness direction. This enables the formation of an interconnect structure in an interlayer dielectric which has regions with different film qualities and in which no interface exists. Specifically, since no interface between films exists in the interlayer dielectric, films are not separated from each other. Furthermore, since there does not exist any interface located in the interlayer dielectric and forming a leakage path between an adjacent pair of interconnects with different potentials or between an adjacent pair of vias with different potentials, this can increase the reliability of the semiconductor device.

Incidentally, with a decrease in the dielectric constant of a low-dielectric-constant interlayer dielectric, the etch rate of the low-dielectric-constant interlayer dielectric typically tends to increase. Therefore, in the process step of forming interconnect trenches in a low-dielectric-constant interlayer dielectric, some of fabrication processes and some of fabrication conditions make it difficult to allow the depths of the interconnect trenches to be uniform, thereby causing variations in the depths of the interconnect trenches. This may result in variations in interconnect resistance of a finished multilayer interconnect structure, and thus, the characteristics of the semiconductor device may vary.

To address this problem, according to this embodiment, the porosity profile of the third insulating film 107 in the thickness direction is set so that the porosity of a region of the interlayer dielectric in which an interconnect is formed (hereinafter referred to as the "interconnect formation region"), i.e., the upper portion of the third insulating film 107, is higher than that of a region thereof in which a via is formed (hereinafter referred to as the "via formation region"), i.e., the lower portion of the third insulating film 107. This can increase the etch selectivity when an interconnect trench is formed in the third insulating film 107 by etching. Specifically, the via formation region of the interlayer dielectric (the lower portion of the third insulating film 107) acts as an etching stopper, thereby providing greater control over fabrication and reducing variations in interconnect resistance.

According to this embodiment, the porosity of the interconnect formation region of the interlayer dielectric (the upper portion of the third insulating film 107) is set high, thereby reducing the interconnect capacitance. By contrast, the via formation region of the interlayer dielectric (the lower portion of the third insulating film 107) has less need for reducing the interconnect capacitance by reducing the dielectric constant of the dielectric material, and thus, the porosity of the region is set low, thereby maintaining the film strength.

The method for fabricating a semiconductor device according to this embodiment will be described below. FIGS. 3A-3D are cross-sectional views of an interconnect structure in process steps in the method for fabricating a semiconductor device according to this embodiment in a sequential order.

Figure 3A:
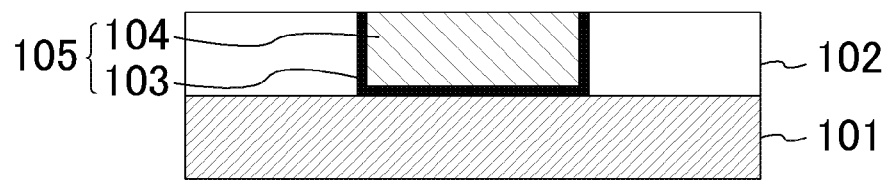
FIGS. 3A-3D are cross-sectional views illustrating an interconnect structure in process steps in a method for fabricating a semiconductor device according to the embodiment of the present disclosure in a sequential order.

First, as illustrated in FIG. 3A, a first insulating film 102 made of, e.g., $SiO_2$ is formed on a substrate 101, and then a resist is applied onto the first insulating film 102, thereby forming an interconnect trench pattern (not shown) by lithography. Next, the first insulating film 102 is etched by dry etching using the interconnect trench pattern as a mask to thereby form an interconnect trench, and then the resist is removed by ashing. Subsequently, a barrier metal film 103 made of, e.g., TaN is formed by sputtering to cover the wall and bottom surfaces of the interconnect trench, and then an interconnect conductive film 104 made of, e.g., Cu is formed on the barrier metal film 103 by electroplating to fill the interconnect trench. Thereafter, an unnecessary portion of the barrier metal film 103 located outside the interconnect trench and an unnecessary portion of the interconnect conductive film 104 located outside the interconnect trench are removed, e.g., by chemical mechanical polishing (CMP), thereby forming a first interconnect 105 including the barrier metal film 103 and the interconnect conductive film 104.

Figure 3B:
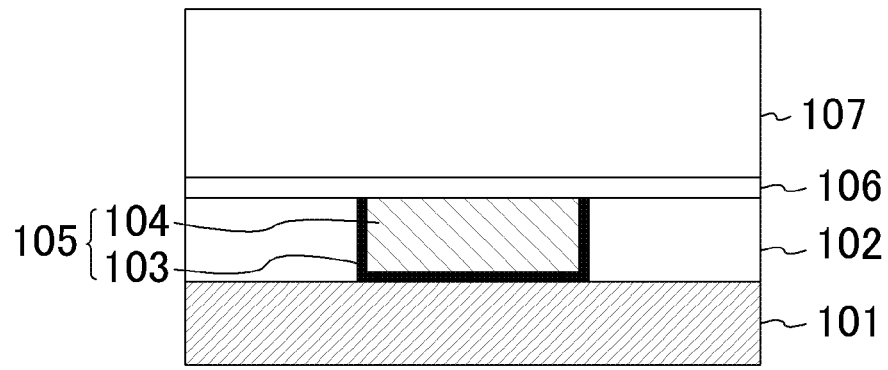

Next, as illustrated in FIG. 3B, a second insulating film 106 made of SiC is formed by using, e.g., chemical vapor deposition (CVD) to cover the first insulating film 102 and the first interconnect 105. Next, a film of which the skeleton is made of, e.g., SiOC and which contains porogens (synonymous with pore-forming material) is formed on the second insulating film 106, e.g., by CVD, and then the porogens in the film are decomposed and removed by irradiating the film with, e.g., ultraviolet light while heating the substrate 101, thereby forming a third insulating film 107 having a plurality of pores.

Figure 3C:
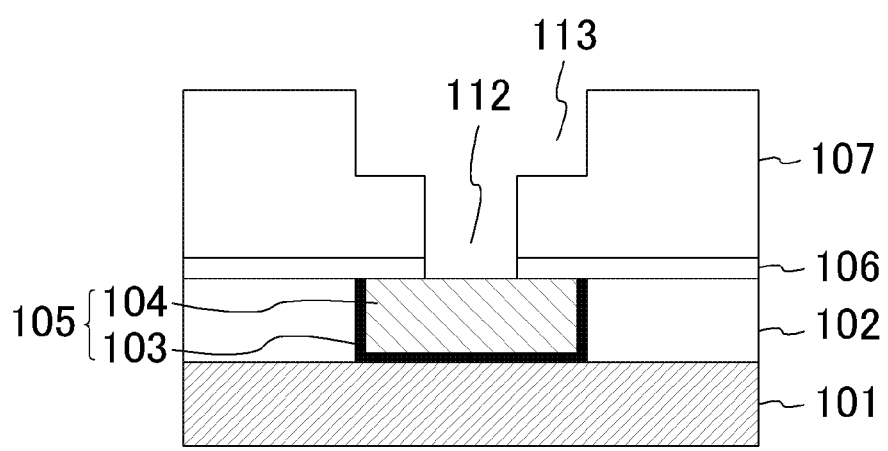

Next, as illustrated in FIG. 3C, a via hole 112 is formed in at least a lower portion of the third insulating film 107, and an interconnect trench 113 is formed in at least an upper portion of the third insulating film 107 so as to be connected to the via hole 112.

Specifically, first, a resist is applied onto the third insulating film 107; a via pattern (not shown) is formed by lithography; and then the third insulating film 107 is etched by dry etching using the via pattern as a mask, thereby forming the via hole 112. Thereafter, the remaining resist pattern (via pattern) is removed by ashing and cleaning. Then, a resist is again applied onto the third insulating film 107; an interconnect pattern (not shown) is formed by lithography; and then the third insulating film 107 is again etched by dry etching using the interconnect pattern as a mask, thereby forming the interconnect trench 113 so as to be connected to the via hole 112. Finally, a portion of the second insulating film 106 exposed at the bottom of the via hole 112 (a portion of the second insulating film 106 located on the first interconnect 105) is removed by dry etching, thereby allowing the via hole 112 to reach the first interconnect 105.

Figure 3D:
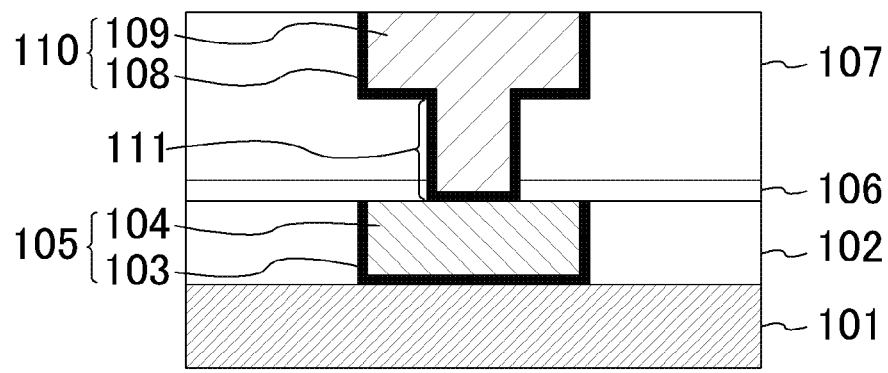

Subsequently, as illustrated in FIG. 3D, a barrier metal film 108 made of, e.g., TaN is formed by sputtering to cover the wall and bottom surfaces of the via hole 112 and the wall and bottom surfaces of the interconnect trench 113, and then an interconnect conductive film 109 made of, e.g., Cu is formed on the barrier metal film 108 by electroplating to fill the via hole 112 and the interconnect trench 113. Thereafter, an unnecessary portion of the barrier metal film 108 located outside the via hole 112 and the interconnect trench 113 and an unnecessary portion of the interconnect conductive film 109 located outside the via hole 112 and the interconnect trench 113 are removed, e.g., by CMP, thereby forming a second interconnect 110 and a via 111 which include the barrier metal 108 and the conductive film 109.

Figure 4:
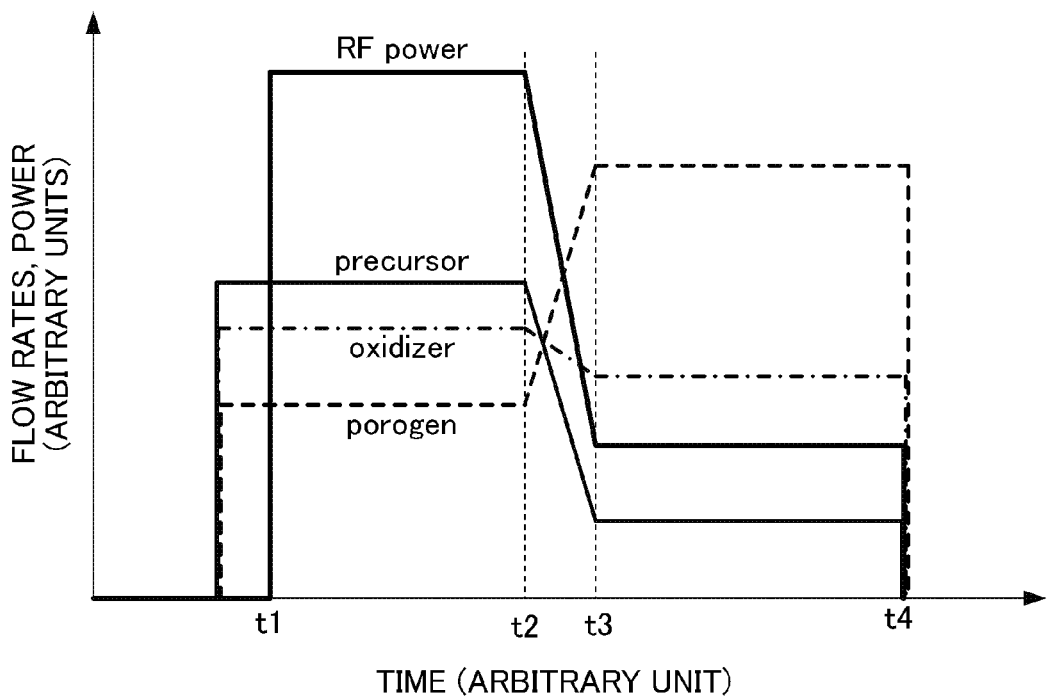
FIG. 4 is an example timing diagram illustrating the flow rates of materials in a mixed gas and high frequency power when the interlayer dielectric is formed by chemical vapor deposition (CVD) in the method for fabricating a semiconductor device according to the embodiment of the present disclosure.

Here, one of the features of this embodiment, i.e., a method for forming a third insulating film 107 will be described in detail. First, the substrate 101 over which the first insulating film 102, the first interconnect 105, and the second insulating film 106 are formed is placed on a hot stage in a CVD chamber maintained under vacuum; a mixed gas containing at least a material forming the basic skeleton of an insulating film (for example, a carbon-containing precursor, such as diethoxymethylsilane (DEMS)), oxygen, and pore-forming material (for example, porogens, such as α-terpinen) is supplied into the CVD chamber together with a carrier gas, such as helium; and application of high frequency power is conducted. FIG. 4 illustrates an example timing diagram of the flow rates of the materials in the mixed gas and the high frequency power (specifically, radio frequency power) in the above-described situation. As illustrated in FIG. 4, first, while DEMS (the precursor), α-terpinen (the porogens), and oxygen (the oxidizer) are supplied into the chamber at flow rates of 0.3 g/min, 0.25 g/min, and 15 cc/min (standard conditions), respectively, application of a high frequency power of 1500 W is conducted (t1), and this state is maintained for a fixed time period (from time t1 to time t2). Next, the flow rates of DEMS, α-terpinen, and oxygen are changed to 0.2 g/min, 0.35 g/min, and 12 cc/min (standard conditions), respectively, for a fixed time period (from time t2 to time t3), and the high frequency power is also changed to 400 W for a fixed time period (from time t2 to time t3). This state is maintained for a fixed time period (from time t3 to time t4).

As described above, in this embodiment, the flow rates of the materials in the mixed gas and the high frequency power are changed over time, thereby forming a film containing porogens (porogen-containing film) on the second insulating film 106.

Figure 5:
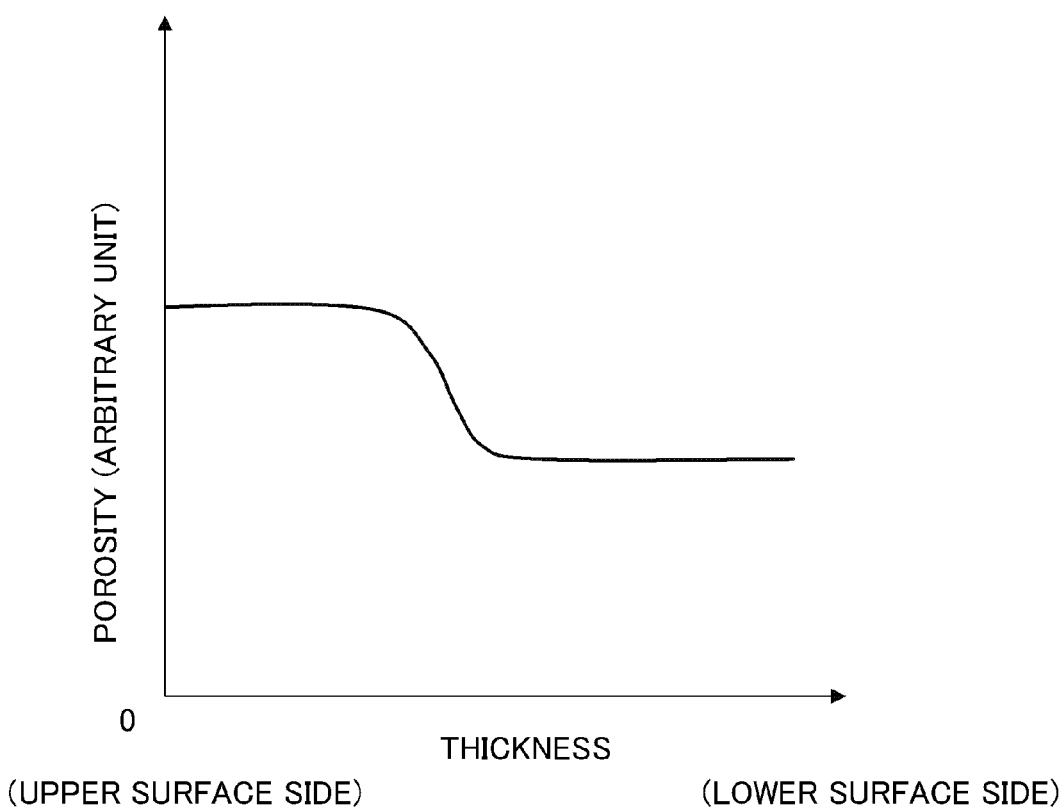
FIG. 5 is a graph illustrating the porosity profile of the interlayer dielectric of the semiconductor device according to the embodiment of the present disclosure in a thickness direction.
Figure 6:
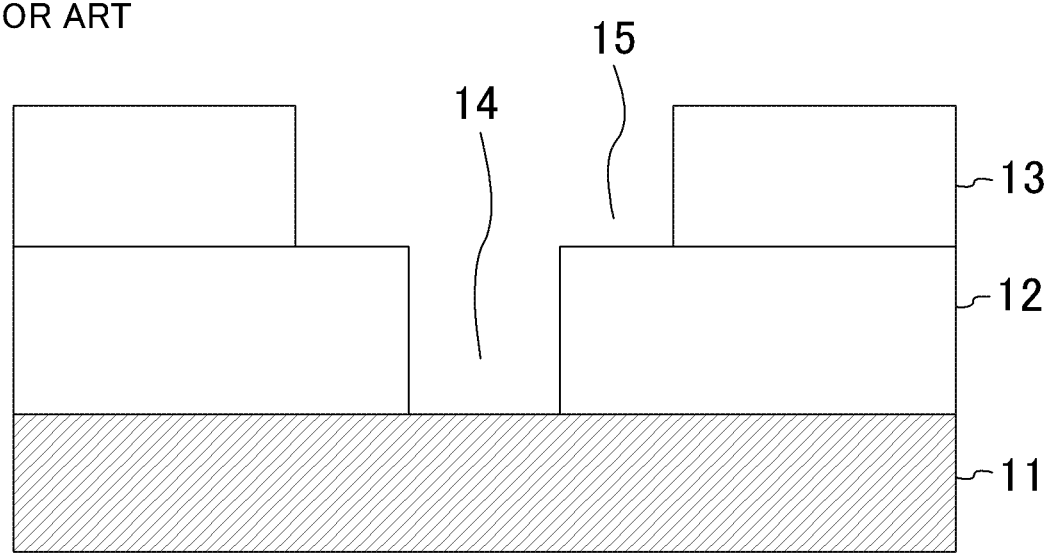
FIG. 6 is a diagram illustrating a cross-sectional structure of a conventional semiconductor device using a low-dielectric-constant interlayer dielectric.

Next, the substrate 101 over which a porogen-containing film is formed on the second insulating film 106 is placed on a hot stage in a chamber maintained under vacuum, and the porogen-containing film is irradiated with ultraviolet light in a wavelength region of 200-400 nm. Thus, the porogens in the porogen-containing film are decomposed and removed, thereby forming the third insulating film 107 of which the interconnect formation region (higher-porosity region) has, e.g., a porosity greater than or equal to about 15% and less than or equal to about 35% and of which the via formation region (lower-porosity region) has a porosity greater than or equal to about 5% and less than or equal to about 25%. Clearly, the porosity of the higher-porosity region of the same third insulating film 107 cannot be lower than that of the lower-porosity region thereof. FIG. 5 illustrates the porosity profile of the third insulating film 107 in the thickness direction. In this embodiment, the porogen-containing film is formed on the condition that the ratio of the porogens to the precursor in the first half of the film formation is set higher than that in the second half of the film formation, thereby forming the third insulating film 107 with a quality in which the porosity of a portion of the third insulating film 107 located near the upper surface thereof in the thickness direction is relatively high.

In this embodiment, the precursor and the porogens which are materials forming the third insulating film 107 are not limited to the above-described DEMS and α-terpinen, respectively. Furthermore, even with a clear difference between a material for use in the formation of the higher-porosity region of the insulating film and that for use in the formation of the lower-porosity region thereof, as long as a film of which the porosity is varied in the thickness direction can be formed, no particular problem arises.

In this embodiment, the condition on which the third insulating film 107 is formed is not limited to the above-described condition. For example, the higher-porosity region is suitable for the interconnect formation region. Thus, the ratio of the porogens in the formation of the interconnect formation region of the third insulating film 107 is further increased, thereby further increasing the porosity of the interconnect formation region of the third insulating film 107. This can provide a semiconductor device having an interconnect structure with a lower interconnect capacitance.

In this embodiment, when the third insulating film 107 is formed, the flow rates of the precursor, oxygen, and the porogens, and the high frequency power are varied over time. However, this is not restrictive. When the flow rate of at least the precursor or the porogens is varied over time, the third insulating film 107 of which the porosity is varied in the thickness direction can be formed.

In this embodiment, times t1, t2, t3, and t4 in the timing diagram (FIG. 4) during the formation of the third insulating film 107 using CVD may be optionally set in response to desired thicknesses (the total thickness of the third insulating film 107, the thickness of the interconnect formation region thereof, and the thickness of the via formation region thereof). Moreover, as long as a period of time long enough to stabilize the flow rates, pressures, etc., of gases for use in the formation of the higher-porosity region of the insulating film can be ensured, the time interval from time t2 to time t3 is preferably set as short as possible in order to reduce the thickness of a region of the third insulating film 107 of which the porosity varies (the third region $R_C$ in FIG. 2) in terms of the etch selectivity.

In this embodiment, the lower limit of the porosity of the via formation region (the lower-porosity region) of the third insulating film 107 is about 5%. However, alternatively, an insulating film of which the lower limit of the porosity is set at substantially 0%, e.g., by selecting an appropriate precursor species or appropriately adjusting the flow rate of the porogens may be formed.

In this embodiment, the method for decomposing and removing porogens is not limited to the above-described ultraviolet irradiation, and other methods in which porogens in a film can be decomposed and removed, such as electron beam irradiation and heat treatment, may be used.

In this embodiment, the material of the third insulating film 107 which is a low-dielectric-constant interlayer dielectric is not limited to the carbon-containing silicon oxide film (the SiOC film) described above, and any other low-dielectric-constant insulating film, such as a fluorine-containing silicon oxide film (a fluorinated silicate glass (FSG) film), may be used.

In this embodiment, the material of the barrier metal films 103 and 108 and the material of the interconnect conductive films 104 and 109 are not limited to tantalum nitride and Cu, respectively, described above. For example, Ta, Ti, TiN, Ru, or RuN may be used as a material of the barrier metal films 103 and 108.

Here, when, as in this embodiment, instead of a conventionally used aluminum alloy material, copper (Cu) having a lower resistivity is used as a material of a conductive film for use in a multilayer interconnect structure, patterning using dry etching becomes difficult. For this reason, as a formation process for a multilayer interconnect using Cu, a damascene process is typically used in which an interconnect trench is formed in an insulating film and then filled with a Cu film, and an interconnect is formed by removing an unnecessary portion of the Cu film using CMP. In particular, when, as in this embodiment, a dual damascene process is used in which a via hole and an interconnect trench are formed and then filled with Cu at the same time to thereby form an interconnect and a via, this process is useful for reducing the number of process steps.

What is claimed is:

1. A semiconductor device comprising:
   an interlayer dielectric with a single-layer structure having a plurality of pores;
   an interconnect formed in at least an upper portion of the interlayer dielectric; and
   a via formed in at least a lower portion of the interlayer dielectric and connected to the interconnect,
   wherein a porosity of the interlayer dielectric per unit volume varies in a thickness direction, and
   a porosity of a region of the interlayer dielectric located in a range between a height of an upper surface of the interconnect and a height of a lower surface of the interconnect is higher than that of a region of the interlayer dielectric located in a range between a height of a surface of the via connected to the interconnect and a height of a lower surface of the via.

2. A method for fabricating a semiconductor device including an interlayer dielectric with a single-layer structure having a plurality of pores, the method comprising:
   forming the interlayer dielectric including at least a first region and a second region by changing a porosity of the interlayer dielectric per unit volume in a thickness direction so that a porosity of the first region is higher than a porosity of the second region, the first region being disposed at a higher position than the second region;
   forming a via in the second region; and
   forming an interconnect in the first region.

3. The method of claim 2, wherein
   in the forming the interlayer dielectric, the interlayer dielectric is formed to have a third region which is interposed between the first region and the second region and of which porosity continuously varies.

4. The method of claim 2, wherein
   in the forming the interlayer dielectric, the interlayer dielectric is formed by chemical vapor deposition.

5. The method of claim 2, wherein
   the forming the interlayer dielectric includes:
   forming a film containing a pore-forming material by using a precursor which forms at least a skeleton of the interlayer dielectric and the pore-forming material while changing a flow rate of at least one of the precursor and the pore-forming material over time; and
   removing the pore-forming material from the film by subjecting the film to heat treatment or irradiating the film with electron beams or ultraviolet light, thereby forming the interlayer dielectric.

6. The semiconductor device of claim 1, wherein
   a porosity of a portion of the interlayer dielectric located near the height of the surface of the via connected to the interconnect continuously varies.

7. A semiconductor device comprising:
   an interlayer dielectric with a single-layer structure having a plurality of pores,
   wherein a porosity of the interlayer dielectric per unit volume varies in a thickness direction, and
   the interlayer dielectric has a first region of which porosity is relatively high, a second region of which porosity is relatively low, and a third region which is interposed between the first region and the second region and of which porosity continuously varies.

* * * * *